(12) United States Patent
Matsuoka et al.

(10) Patent No.: US 6,418,173 B1
(45) Date of Patent: Jul. 9, 2002

(54) TRANSMISSION APPARATUS

(75) Inventors: Akihiko Matsuoka, Yokohama; Masayuki Orihashi, Ichikawa; Morikazu Sagawa, Inagi; Kenichi Takahashi, Kawasaki; Kouei Misaizu, Yokohama, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/101,443

(22) PCT Filed: Nov. 13, 1997

(86) PCT No.: PCT/JP97/04132

§ 371 (c)(1),
(2), (4) Date: Jul. 15, 1998

(87) PCT Pub. No.: WO98/23068

PCT Pub. Date: May 28, 1998

(30) Foreign Application Priority Data

Nov. 19, 1996 (JP) .................................. 8-307685
Nov. 19, 1996 (JP) .................................. 8-307686

(51) Int. Cl.[7] .......................... H04K 1/02; H04L 25/03; H04L 25/49
(52) U.S. Cl. ....................................... 375/297; 375/254
(58) Field of Search ................................. 375/297, 254, 375/285, 296; 455/115, 116, 295, 296

(56) References Cited

U.S. PATENT DOCUMENTS

| | | | |
|---|---|---|---|
| 4,236,042 A | * 11/1980 | Leitch | 179/1 GS |
| 5,201,070 A | 4/1993 | Iwahashi | 455/91 |
| 5,533,048 A | * 7/1996 | Dolan | 375/222 |
| 5,603,105 A | * 2/1997 | Iwahashi | 455/110 |
| 5,699,383 A | 12/1997 | Ichiyoshi | 375/297 |
| 6,032,028 A | * 2/2000 | Dickey et al. | 455/110 |

FOREIGN PATENT DOCUMENTS

| | | |
|---|---|---|
| EP | 0 493 956 | 7/1992 |
| EP | 0 731 556 | 9/1996 |
| JP | 4290321 | 10/1992 |
| JP | 6-6394 | 1/1994 |
| JP | 7283841 | 10/1995 |
| JP | 8251246 | 9/1996 |

OTHER PUBLICATIONS

A Japanese Language abstract of JP 8–251246.
A Japanese Language abstract of JP 7–283841.
A Japanese Language abstract of JP 6–6394.
A Japanese Language abstract of JP 4–290321.

* cited by examiner

Primary Examiner—Mohammad H. Ghayour
(74) Attorney, Agent, or Firm—Greenblum & Bernstein P.L.C.

(57) ABSTRACT

Nonlinear distortion compensating data is calculated by approximation equations at a compensating coefficient calculation section using an amplitude value of transmission quadrature base band signals obtained by a power calculating section, wherein by carrying out nonlinear distortion compensation at a nonlinear distortion compensating section using the data, it is possible to compensate nonlinear distortion generated in an amplifier of the transmission system without use of any memory table, and a nonlinear distortion compensating section can be obtained, which has a great effect of decrease distortion.

28 Claims, 11 Drawing Sheets

TRANSMISSION APPARATUS

TECHNICAL FIELD

The present invention relates to a nonlinear distortion compensating technique in a transmission apparatus for digital radio communications.

BACKGROUND ART

In recent years, a mobile communication system using a digital modulation method has vigorously been researched and developed. If a high efficiency amplifier is employed in the transmission system in order to attempt to save power at a radio transceiver, nonlinear distortions frequently result therefrom. As a means, there is a method for compensating nonlinear distortions of amplitude and phase with reference to a distortion compensating table, by using an amplitude value of transmission base band signals.

A description is given of a conventional transmission apparatus which compensates nonlinear distortions by using such a method.

FIG. 10 is a main block diagram of a conventional transmission apparatus. In FIG. 10, amplitude calculating section 1001 calculates amplitude information 1010 of transmission signals 1009 (transmission digital quadrature base band of I and Q channels), and compensation table 1002 outputs distortion compensating coefficient 1011. The distortion compensating section 1003 outputs a distortion compensating signal 1012 according to the transmission signal 1009 and distortion compensating coefficient 1011. The outputted distortion compensation signal 1012 is quadrature-modulated by quadrature modulating section 1004, and the modulated signal 1013 is amplified by amplifier 1005, wherein amplified RF signal 1014 is outputted.

Furthermore, demodulating section 1007 demodulates feedback RF signal 1016 fed back from coupler 1006 to feedback base band signal 1017, and estimating section 1008 updates the distortion compensation coefficient of compensation table 1002 on the basis of a distortion compensation coefficient 1018, transmission signal 1009 and feedback base band signal 1017. Through the abovementioned actions, amplified RF signal 1015 for which nonlinear distortion compensation is carried out is outputted from the coupler 1006.

In addition thereto, as a method to compensate nonlinear distortions in the transmission system, there is a method having a digital filter to which a ROM (Read-only-memory) is attached, wherein compensation is carried out by applying in advance distortions to compensate nonlinear distortions generated in an amplifier by the digital filter.

The main block diagram of a conventional transmission apparatus in which this method is employed is shown in FIG. 11. Hereinafter, a description is given to this apparatus.

In FIG. 11, digital filter 1102 in which digital signals 1101 is inputted gives to the digital signal 1101 distortions to compensate nonlinear distortion components generated in radio frequency power amplifier 1105, by using distortion information stored in a ROM in advance.

The digital signal 1101 to which distortion to be compensated is given is digital-analog converted and modulated by quadrature modulating section 1103 and inputted into the radio frequency power amplifier 1105 via transmission section 1104. In the radio frequency power amplifier 1105, since distortion of the inputted digital signal are compensated in advance, distortions generated at the radio frequency power amplifier 1105 are cancelled by those for compensation.

Furthermore, instead of ROM, there is still another method to compensate nonlinear distortions, in which a RAM (Random Access Memory) having compensation coefficients stored therein in order to compensate nonlinear distortion components is used, by varying the compensation coefficients of the RAM in compliance with amplitudes of digital signals.

Furthermore, Unexamined Japanese Patent Publication No. 290321 of 1992 discloses a method for controlling actions of a digital filter by feeding outputs of a radio frequency power amplifier back to the digital filter.

However, in the conventional example shown in FIG. 10, it is necessary that signals having the maximum amplitude is suppressed less than the maximum output of amplifier 1005, and this results in a lowering of efficiency in the amplifier 1005.

In the conventional example shown in FIG. 11, since it is necessary to provide a memory table such as a ROM or RAM in which compensation coefficients are stored to compensate nonlinear distortion components, and this results in an increase of the scale of transmission circuits themselves.

DISCLOSURE OF INVENTION

It is therefore an object of this invention to provide a transmission apparatus capable of easily controlling leak power and easily improving the efficiency of power amplification and cable of compensating nonlinear distortions generated in a transmission system amplifier without any use of a memory table such as a ROM or RAM.

The first aspect of the invention resides in a transmission apparatus having a nonlinear distortion compensating circuit, which includes an amplitude limiting function for transmission quadrature base band signals by adding an amplitude calculating section, an amplitude limiting table and an amplitude limiting section thereto. Thereby, it is possible to easily improve the efficiency of amplification section with distortions of the entire system limited.

The second aspect of the invention is such that nonlinear distortion compensation is carried out on the basis of nonlinear distortion compensation coefficients calculated by an approximation equation in a compensation coefficient calculating section. Thereby, it is possible to compensate nonlinear distortions generated by amplifier in the transmission system without any use of a memory table such as a ROM or RAM, and it is possible to make a nonlinear distortion compensating section small-sized.

Furthermore, this invention is constructed so that it is provided with a first amplitude calculating section for calculating the first amplitude value of transmission quadrature base band signals; an amplitude limiting table for storing amplitude limiting information corresponding to the first amplitude value; a first amplitude limiting section for limiting the amplitude of the transmission quadrature base band signals by using the amplitude limiting information; a quadrature modulating section for outputting RF signals by quadrature-modulating the transmission quadrature base band signals, the amplitude of which is limited; and an amplification section for amplifying the RF signals.

With this construction, it is possible to improve the efficiency of an amplifying section with distortion components limited, by executing distortion compensation of an amplifier with respect to limited signals, the maximum amplitude of which is distorted by the transmission quadrature base band signals.

Furthermore, the invention is constructed so that it is provided with a first amplitude calculating section for calculating the first amplitude value from transmission quadrature base band signals; a limiting coefficient calculating section for calculating an amplitude limiting coefficient corresponding to the first amplitude value; a second amplitude limiting section for limiting the amplitude of the transmission quadrature base band signal by using the amplitude limiting coefficient; a quadrature modulating section for quadrature-modulating the transmission quadrature base band signals to output RF signals, the amplitude of which is limited; and an amplification section for amplifying the RF signals.

With this construction, the amplitude limiting coefficient is calculated on the basis of amplitude information of the transmission quadrature base band signals, whereby it is possible to improve the efficiency of amplifier by limiting the amplitude of transmission signals in compliance with the amplitude limiting coefficient with the distortion components limited, without adding any memory thereto.

Furthermore, this invention is constructed so that it is provided with a power calculating section for calculating a power value of transmission quadrature base band signals; a compensation coefficient calculating section for calculating a nonlinear distortion compensation coefficient according to approximation equation set in advance using the power value; a distortion compensating section for carrying out nonlinear distortion compensation of the transmission quadrature base band signals by using the nonlinear distortion compensation coefficient; a quadrature modulating section for quadrature-modulating transmission quadrature base band signals, the distortion of which is compensated; and an amplifier for amplifying the quadrature modulation signal.

With this construction, with only slight memory capacity, it is possible to compensate nonlinear distortion which is generated at an amplifier of transmission system.

Furthermore, the invention is constructed so that it is provided with a power calculating section for calculating a power value of transmission quadrature base band signals; a compensation coefficient calculating section for calculating an amplitude distortion compensation coefficient by an approximation equation set in advance by using the power value; a quadrature modulating section for quadrature-modulating the transmission quadrature base band signals; and an amplitude distortion compensating section for compensating amplitude distortions of quadrature modulation signals using the amplitude distortion compensation coefficient.

With this construction, it is possible to compensate amplitude distortions, which is generated at an amplifier of transmission system, with simple calculations and slight memory capacity.

Furthermore, the invention is constructed so that it is provided with a power calculating section for calculating a power value of transmission quadrature base band signals; a compensation coefficient calculating section for calculating an amplitude distortion compensation coefficient by an approximation equation set in advance by using the power value; a quadrature modulating section for quadrature-modulating the transmission quadrature base band signals; an amplitude distortion compensating section for compensating amplitude distortions of quadrature modulation signals by using the amplitude distortion compensating coefficient; an amplifier for amplifying modulation signals; a distributor for distributing output of the amplifier; a quadrature demodulator for carrying out quadrature demodulate with one of the outputs of the distributor inputted; and a coefficient updating section which calculates an error by comparing quadrature demodulate signals with the power value and updates the value of coefficients of the approximation equation on the basis of the error.

With this construction, it is possible to very accurately compensate amplitude distortions by lowering the error of amplitude distortion compensation data calculated by an approximation equation through a feedback loop.

BEST MODE FOR CARRYING OUT THE INVENTION

Hereinafter, a detailed description is given of embodiments of a transmission apparatus according to the invention.

(Embodiment 1)

Figure 1:
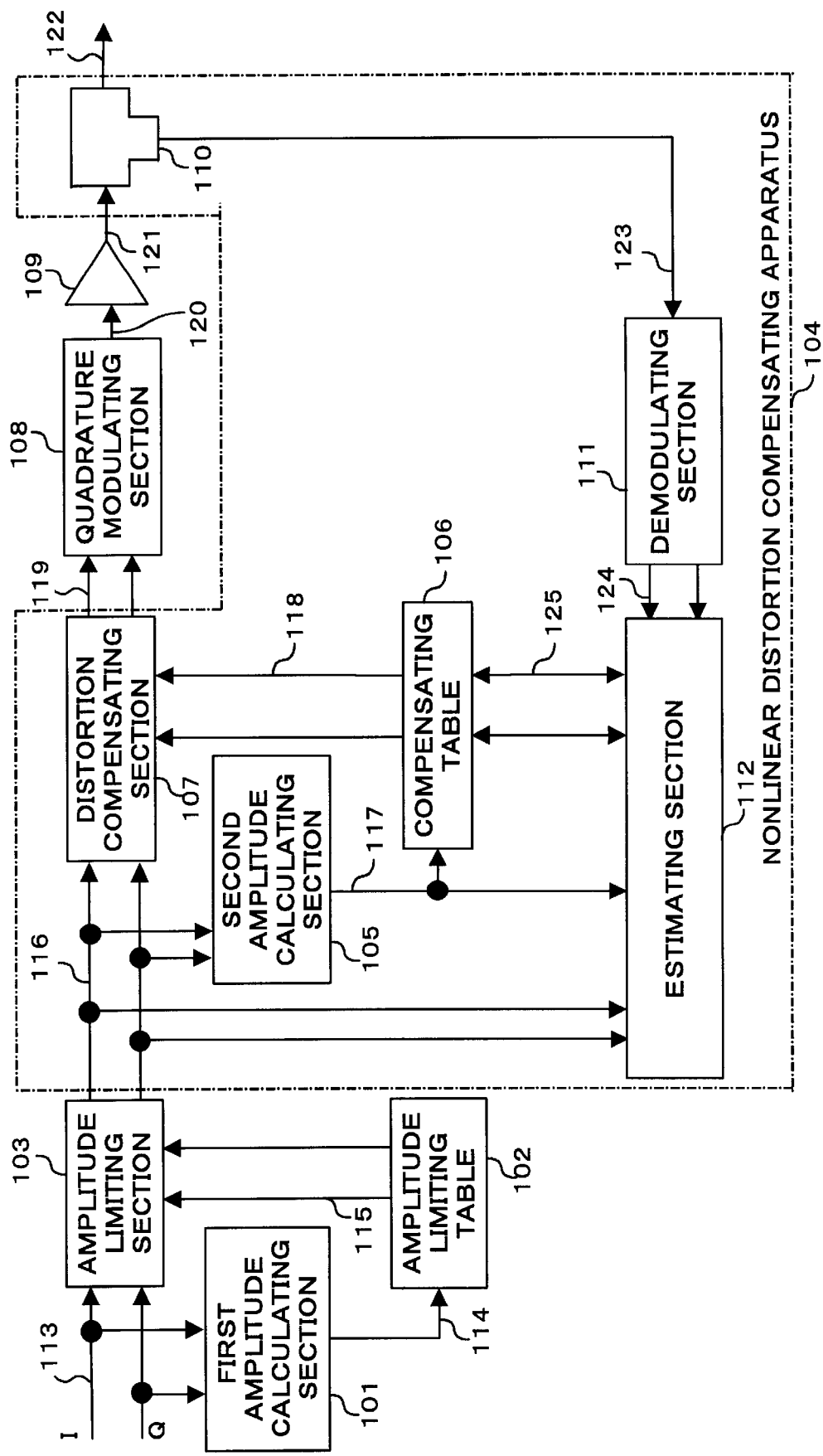
FIG. 1 is a main block diagram of a transmission apparatus according to a first embodiment of the invention.

FIG. 1 is a main block diagram of a transmission apparatus according to a first embodiment of the invention.

A transmission apparatus illustrated in FIG. 1 comprises first amplitude calculating section 101, amplitude limiting table 102, amplitude limiting section 103, nonlinear distortion compensating section 104, quadrature modulating section 108, amplification section 109, etc.

Nonlinear distortion compensating section 104 has second amplitude calculating section 105, compensating table 106 using a RAM, distortion compensating section 107, coupler 110, demodulating section 111, and estimating section 112.

Furthermore, in FIG. 1, reference number 113 indicate a transmission signal (Transmission digital quadrature base band signal in I and Q channel), reference number 114 indicate amplitude information of the transmission signal, reference number 115 indicate an amplitude limiting coefficient, reference number 116 indicate an amplitude limiting signal, reference number 117 indicate limiting amplitude information, reference number 118 indicate a distortion compensation coefficient, reference number 119 indicate a distortion compensation signal, reference number 120 indicate an RF signal, reference number 121 indicate an amplitude RF signal, reference number 122 indicate an output signal, reference number 123 indicate a feedback RF signal, reference number 124 indicate a feedback base band signal, and reference number 125 indicate a coefficient updating signal.

A description is given of the actions of a transmission apparatus constructed as described above.

The first amplitude calculating section 101 calculates amplitude information 114 on the basis of transmission signal 113 and outputs it. In amplitude limiting table 102, proper amplitude limiting information is stored in advance with respect to a modulation method designed on the basis of noise margin and leak power value as its entirety, and amplitude limiting coefficient 115 is outputted in response to amplitude information 114.

Amplitude limiting section 103 limits the amplitude of transmission signal 113 in accordance with the amplitude limiting coefficient 115 and outputs an amplitude limiting signal 116 thus obtained. The amplitude limiting executed herein is to limit the protrudent amplitude in only a slightly short time. Furthermore, it is clear that the leak power of amplitude limiting signal 116 can be designed in advance on the basis of a modulation method and amplitude limiting information.

Figure 10:
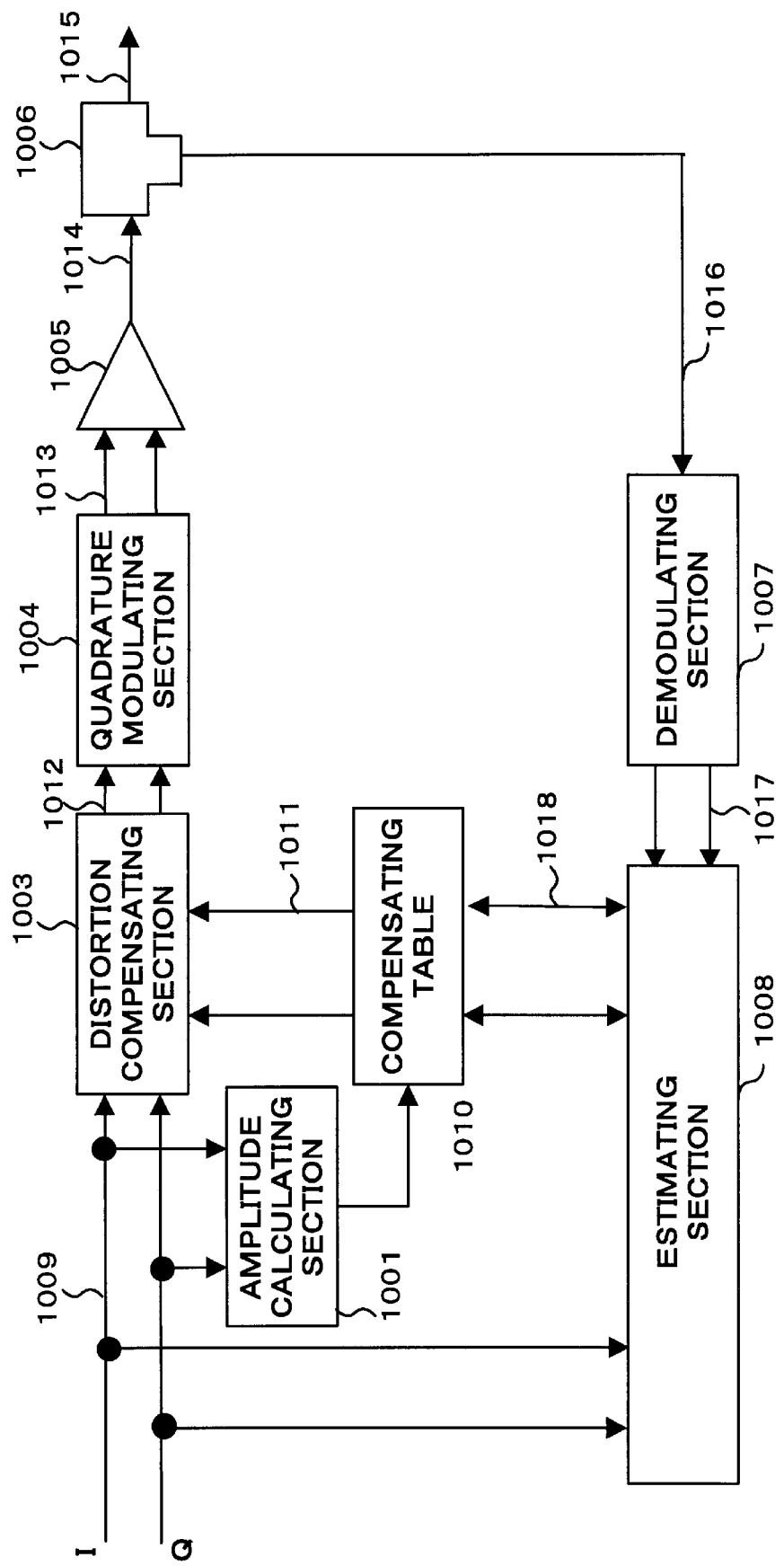
FIG. 10 is a main block diagram of a conventional transmission apparatus.
Figure 11:
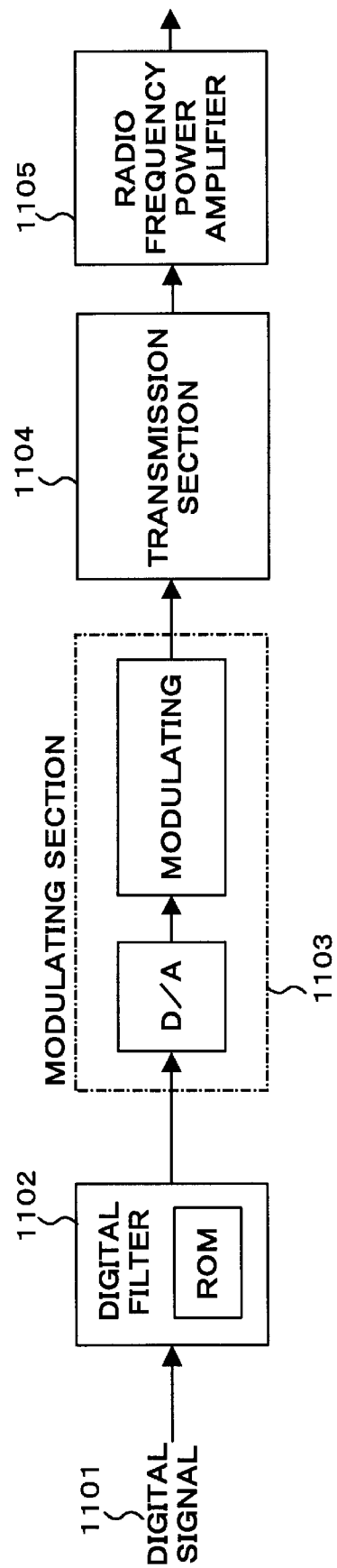
FIG. 11 is a main block diagram of another conventional apparatus other than the above apparatus.

Nonlinear distortion compensating section 104 compensates nonlinear distortions of amplifier 109 almost as in the description with reference to FIG. 10 in the conventional example.

That is, the second amplitude calculating section 105 calculates limiting amplitude information 117 from amplitude limiting signal 116 and outputs it. Compensation table 106 outputs distortion compensation coefficient 118 in response to limiting amplitude information 117. Distortion compensating section 107 calculates distortion compensation signal 119 on the basis of distortion compensation coefficient 118 and amplitude limiting signal 119. Quadrature modulating section 108 modulates distortion compensation signals 119 to radio frequency (RF) signals 120 which are signals of carrier band. Amplifier 109 amplifies the power of RF signals 120 and outputs amplified RF signals 121.

Coupler 110 outputs a part of amplified RF signals 121 as a feedback RF signal 123 and outputs the remaining thereof as output signals 122. Demodulator 111 demodulates the feedback RF signal 123 to a feedback base band signal 124. The estimating section 112 updates, using the amplitude limiting signal 116 as a target value, distortion compensation coefficients stored in the compensation table 106 by a coefficient updating signal 125 in compliance with a distortion compensation coefficient 118 read by the coefficient updating signal 125, limiting amplitude information 117 and feedback base band signal 124.

As a result, the linearity between amplitude limiting signal 116 and feedback base band signal 124 will be retained by a distortion compensation coefficient stored in compensation table 106.

The distortion components of the output signal 122 are equalized to the distortion components of the amplitude limiting signal 116. As described above, the amplitude limiting signal 116 can be easily designed on the basis of modulation method and the amplitude limiting information stored in amplitude limiting table 102, wherein it is possible to control distortion components as the entire system by the amplitude limiting information.

In a prior nonlinear distortion compensation technique, the maximum amplitude signal is assigned to the maximum output value of an amplifier. However, since signals having the maximum amplitude have a very low ratio of existence, they will not exert any great influence as leak power even though the maximum amplitude signals are slightly distorted. Therefore, if the amplitude of the maximum amplitude signals is limited and its average amplitude is relatively raised, it becomes possible to improve the amplification efficiency of an amplifier.

Thus, according to the first embodiment, since the amplitude of signals having a great amplitude is limited before carrying out nonlinear distortion compensation, the maximum amplitude value is lowered, wherein the amplifier 121 has an allowance to improve the mean power.

On the other hand, distortion components, the amplitude of which is limited, can be designed in advance on the basis of its modulation system and limiting properties, the leak power resulting from the nonlinearity outside the signal band can be suppressed less than the prescribed level, wherein the area of nonlinearity of the amplifier 121 is used to cause the efficiency of power amplification to be improved.

Thus, since it is possible to easily control the distortion components, it is possible to construct a more efficient transmission apparatus than that according to the prior nonlinear distortion compensation technique.

Generally, suppression of signals having a great amplitude is effective in improving the efficiency. However, it is also possible to secure the same effect by elongating signals having a small amplitude. Furthermore, by making the amplitude width narrow by a combination of the former and the latter, the efficiency can be further improved.

(Embodiment 2)

Figure 2:
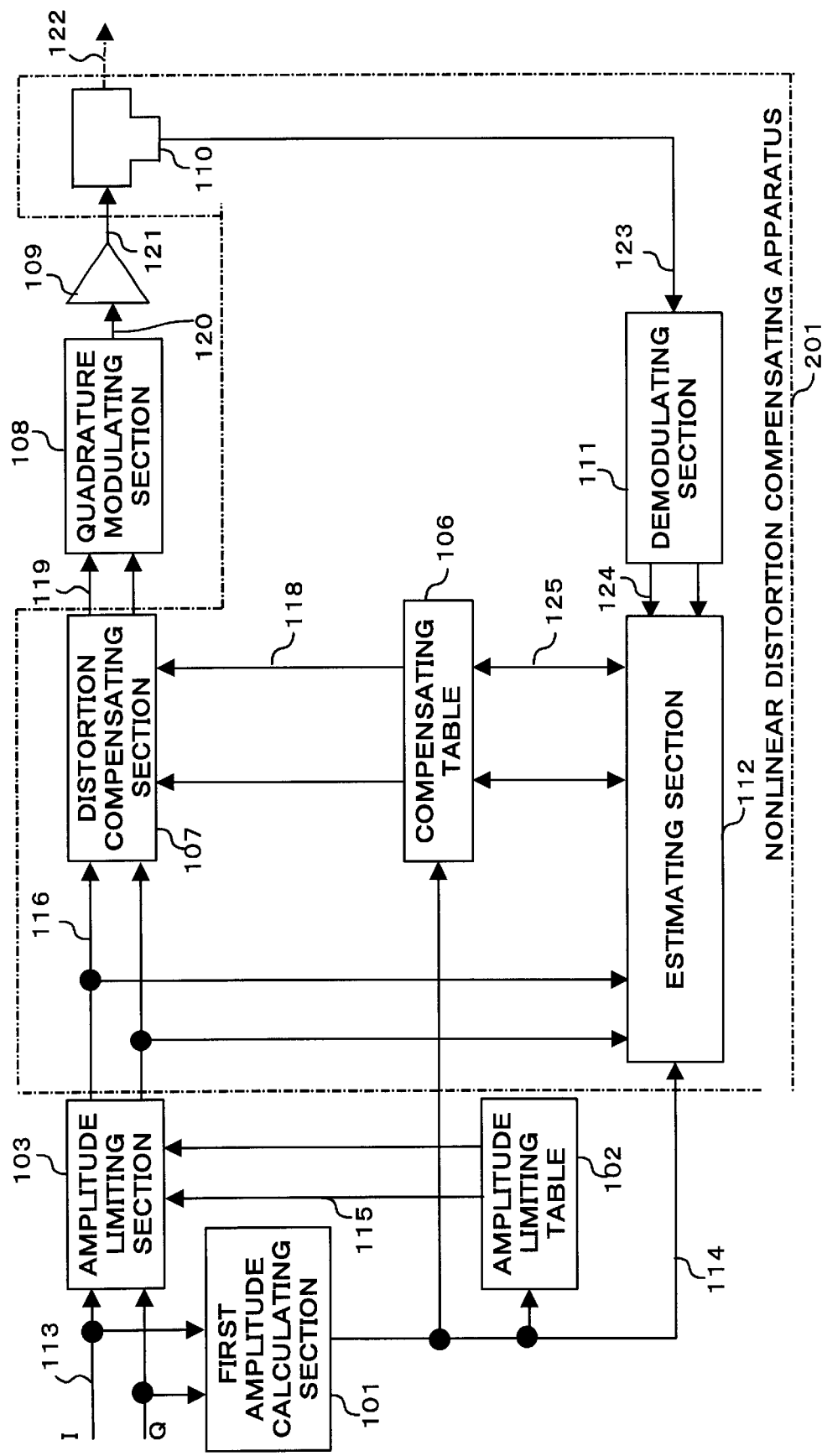
FIG. 2 is a main block diagram of a transmission apparatus according to a second embodiment of the invention.

FIG. 2 is a main block diagram of a transmission apparatus according to a second embodiment of the invention. However, parts in the second embodiment illustrated in this drawing, which correspond to those of the first embodiment illustrated in FIG. 1 are given the same reference numbers, and the description thereof is omitted.

A transmission apparatus shown in FIG. 2 is different from that shown in FIG. 1 in that, as shown at the nonlinear distortion compensating section 201 of FIG. 2, the second amplitude calculating section 105 of the nonlinear distortion compensating section 104 shown in FIG. 1 is omitted, and amplitude information 114 of the transmission signals outputted from the amplitude calculating section 101 is outputted to the compensation table 106 and estimating section 112.

In such a construction, amplitude information 114 calculated by the first amplitude calculating section 101 is outputted to the compensation table 106 and estimating section 112, and the compensation table 104 outputs distortion compensation coefficients 118 in compliance with the amplitude information 114.

Furthermore, using the amplitude limiting signal 116 as a target value, the estimating section 112 updates the distortion compensation coefficients stored in the compensation table 106 by a coefficient updating signal 125 in compliance with distortion compensation coefficients read from the compensation table 106 by the coefficient updating signal 125, amplitude information 114, and feedback base band signal 124. The other actions are the same as those described in the first embodiment.

Thus, according to the second embodiment, since the nonlinear distortion compensating section 201 is constructed with the amplitude calculating section omitted in addition to securing the same effects as those of the first embodiment, the configuration thereof can be further simplified than the first embodiment. The entire size thereof can be reduced.

(Embodiment 3)

Figure 3:
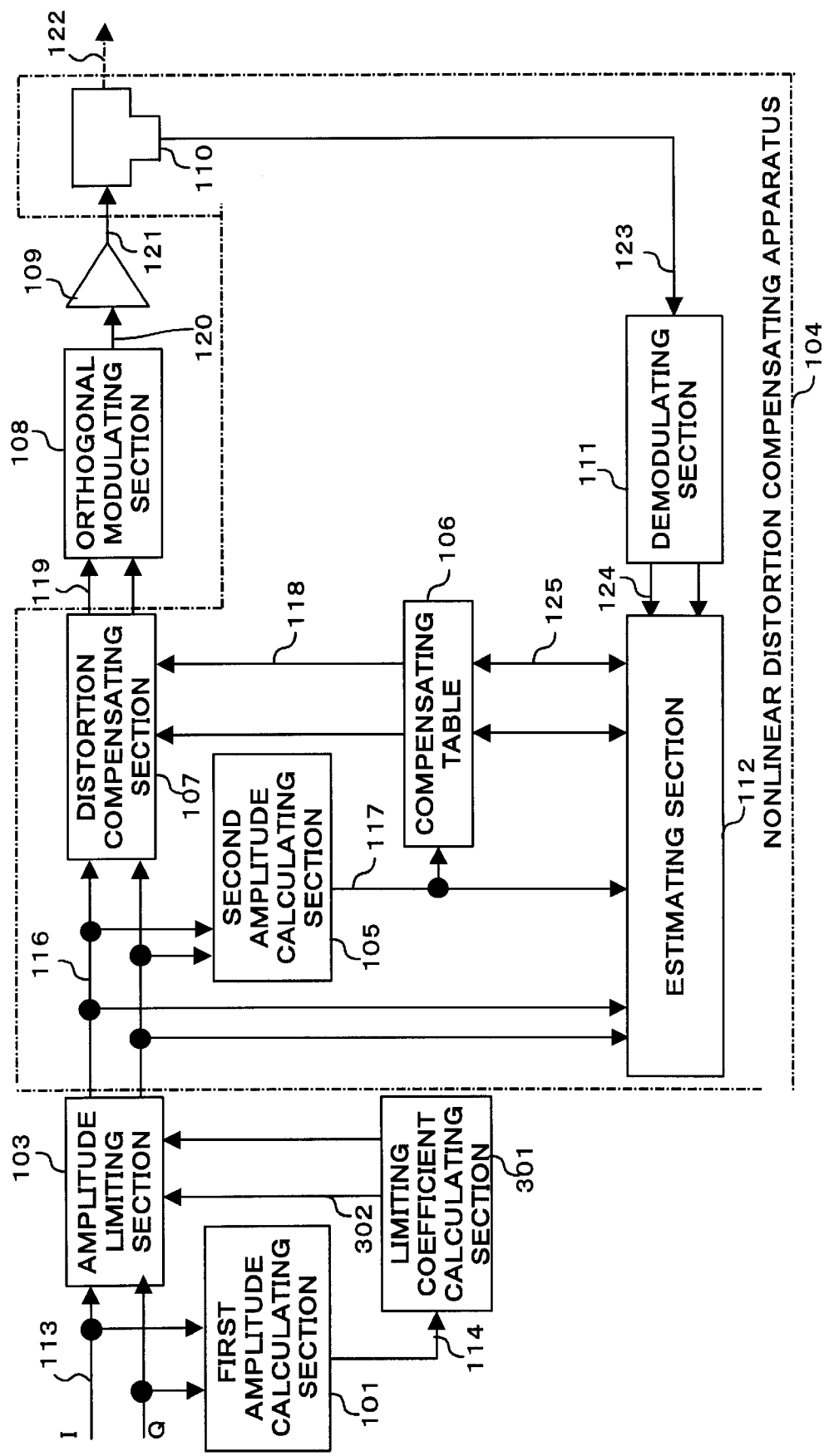
FIG. 3 is a main block diagram of a transmission apparatus according to a third embodiment of the invention.

FIG. 3 is a main block diagram of a transmission apparatus according to a third embodiment of the invention.

However, parts in the third embodiment illustrated in this drawing, which correspond to those of the first embodiment illustrated in FIG. 1 are given the same reference numbers, and the description thereof is omitted.

A transmission apparatus illustrated in FIG. 3 is different from that shown in FIG. 1 in that a limiting coefficient calculating section 301 shown in FIG. 3 is provided instead of the amplitude limiting table 102 shown in FIG. 1 and the amplitude limiting coefficient 302 calculated by the limiting coefficient calculating section 301 is outputted to the amplitude limiting section 103.

Furthermore, a limiting coefficient calculating section 301 can be achieved by a surplus calculation performance of DSP (Digital Signal Processor) (not illustrated) which is a component of the transmission apparatus along with the first amplitude calculating section 101 and amplitude limiting section 103.

In such a construction, in limiting coefficient calculating section 301, a proper amplitude limiting coefficient calculation method is defined in advance with respect to a modulation system which is designed on the basis of noise margin and leak power value as the entire system, and amplitude limiting coefficients 302 are outputted in compliance with the amplitude information 114. The amplitude limiting section 103 calculates amplitude limiting signals 116 on the basis of amplitude limiting coefficient 302 and transmission signal 113.

The amplitude limiting signal 116 can be easily designed by a modulation system and a calculation method defined by the limiting coefficient calculating section 301, wherein it is possible to control distortion components as the entire system by the amplitude limiting coefficient calculation method. The other actions are the same as those of the first embodiment.

Thus, according to the third embodiment, limiting coefficient calculation part 301 which already exists as a component of the transmission apparatus is provided instead of the amplitude limiting table 102 constructed using memories such as a ROM, etc. in addition to securing the same effects as those of the first embodiment. Therefore, it is possible to further simplify the apparatus than the first embodiment, and the entire system can be small-sized.

(Embodiment 4)

Figure 4:
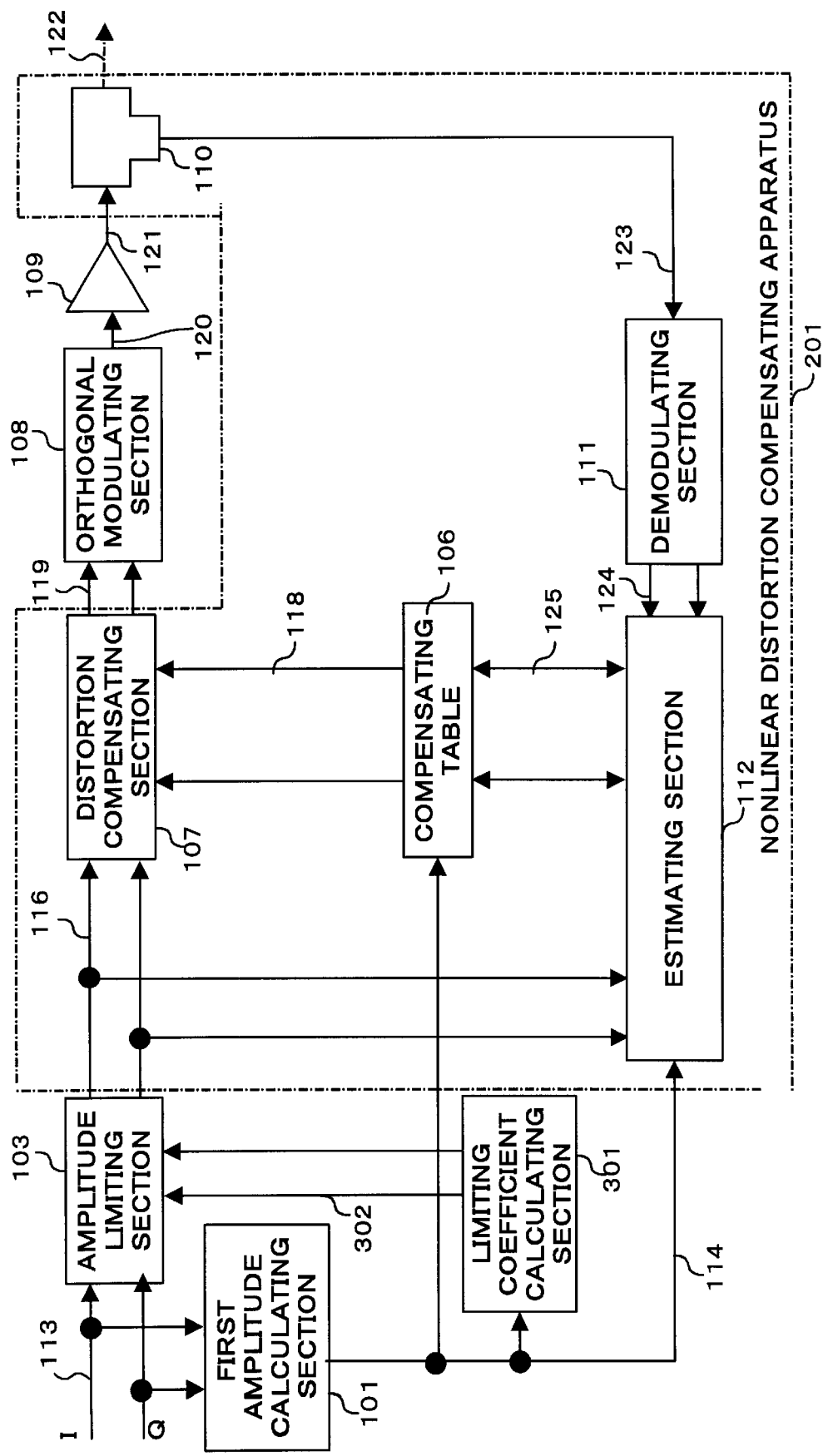
FIG. 4 is a main block diagram of a transmission apparatus according to a fourth embodiment of the invention.

FIG. 4 is a main block diagram of a transmission apparatus according to a fourth embodiment of the invention. However, parts in the fourth embodiment illustrated in this drawing, which correspond to those of the third embodiment illustrated in FIG. 3 are given the same reference numbers, and the description thereof is omitted.

A transmission apparatus illustrated in FIG. 4 is different from that illustrated in FIG. 3 in that, as shown in the nonlinear distortion compensating section 201 in FIG. 4, the second amplitude calculating section 105 of the nonlinear distortion compensating section 104 shown in FIG. 3 is omitted, and amplitude information 114 of transmission signals outputted from the amplitude calculation portion 101 is outputted to the compensation table 106 and estimating section 112.

In such a construction, the amplitude information 114 calculated by the amplitude calculating section 101 is outputted to the compensation table 106 and estimating section 112, wherein the compensation table 104 outputs distortion compensation coefficients 118 in compliance with the amplitude information 114.

Furthermore, using the amplitude limiting signal 116 as a target value, the estimating section 112 updates distortion compensation coefficients stored in the compensation table 106 by a coefficient updating signal 125 in compliance with the distortion compensation coefficient read from the compensation table 106 by the coefficient updating signal 125, amplitude information 114 and feedback base band signal 124. The other actions thereof are the same as those of the third embodiment.

Thus, according to the fourth embodiment, it is possible to obtain effects similar to those of the third embodiment, and since the amplitude calculating section is omitted from the nonlinear distortion compensating section 201, it is possible to further simplify the apparatus than the third embodiment, and the entire system can be small-sized.

(Embodiment 5)

Figure 5:
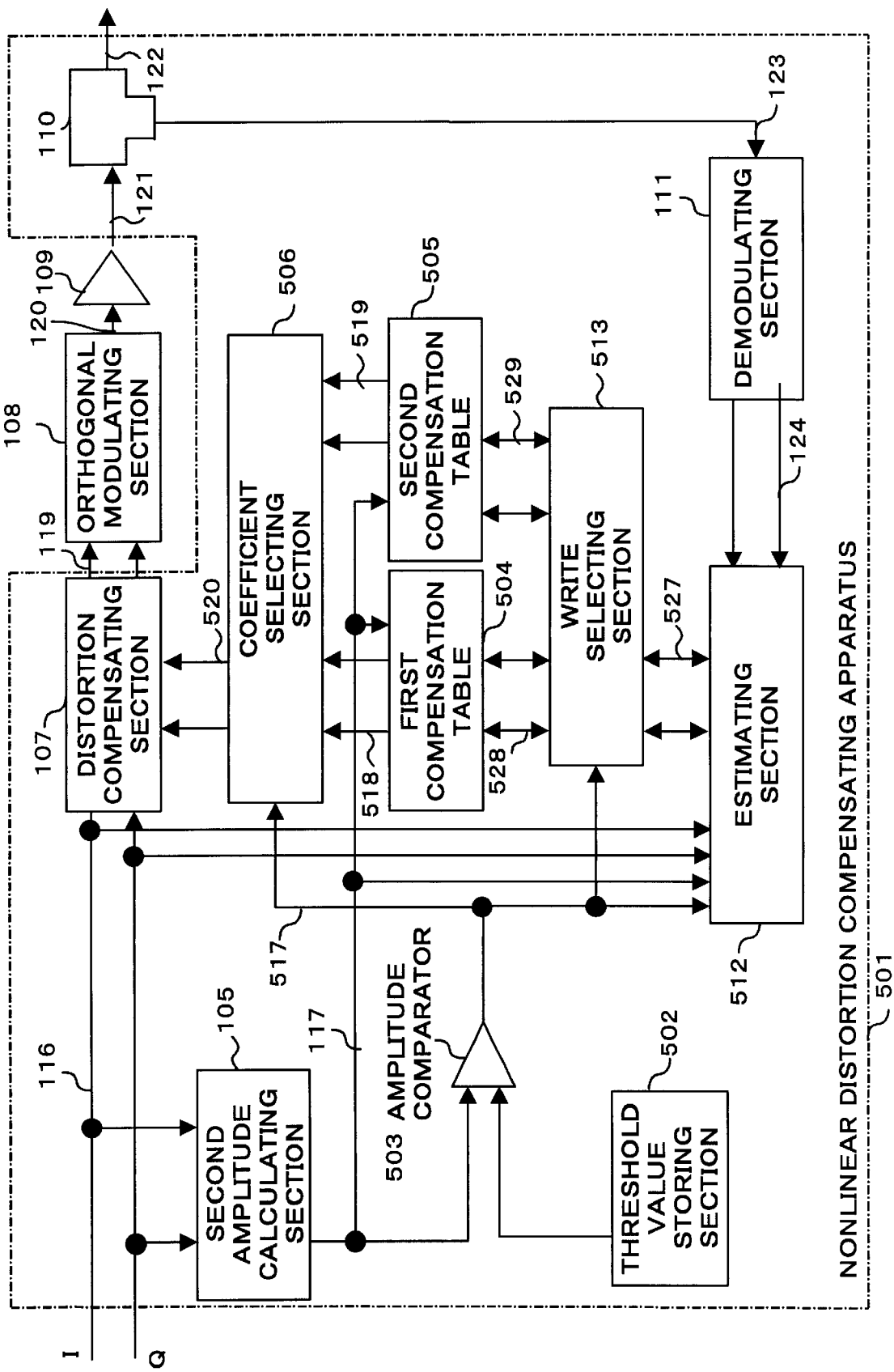
FIG. 5 is a main block diagram of a transmission apparatus according to a fifth embodiment of the invention.

FIG. 5 is a main block diagram of a transmission apparatus according to a fifth embodiment of the invention. However, parts of the fifth embodiment shown in FIG. 5, which correspond to those of the first embodiment shown in FIG. 1, are given the same reference numbers, and the description thereof is omitted.

In FIG. 5, reference number 501 is a nonlinear distortion compensating section, reference number 502 is a threshold value storing section, reference number 503 is an amplitude comparator, reference number 504 is a first compensation table, reference number 505 is a second compensation table, reference number 506 is a coefficient selecting section, reference number 512 is an estimating section, reference number 513 is a writing selecting section, reference number 516 is threshold value information, reference number 517 is a result of amplitude comparison, reference number 518 is a first compensation coefficient, reference number 519 is a second compensation coefficient, reference number 520 is a distortion compensation coefficient, reference number 527 is a coefficient renewing signal, reference number 528 is a first updating signal, reference number 529 is a second updating signal.

A description is given of the actions of a transmission apparatus thus constructed. The amplitude calculating section 105 calculates and outputs amplitude information 117 on the basis of transmission signal 116. The threshold value storing section 502 outputs threshold value information 516. The comparator 503 compares amplitude information 117 with threshold value information 516, and outputs the result 517 of amplitude comparison, which shows whether the amplitude is grater or smaller than the threshold value.

The first compensation table 504 and the second compensation table 505 output the first compensation coefficient 518 and the second compensation coefficient 519 in compliance with amplitude information 117. Coefficient selecting section 506 selects any one of the first compensation coefficient 518 and the second compensation coefficient 519 on the basis of the result 517 of amplitude comparison and outputs distortion compensation coefficient 520.

For example, in a case where the result 517 of amplitude comparison shows that the amplitude is smaller than the threshold value, the coefficient selecting section 506 selects the first compensation coefficient 518 and outputs it as distortion compensation coefficient 520. If it is shown that the amplitude is greater than the threshold value, the coefficient selecting section 506 selects the second compensation coefficient 519 and outputs it as distortion compensation coefficient 520. The distortion compensating section 107 calculates distortion compensation signal 521 on the basis of transmission signal 113 and distortion compensation coefficient 520 and outputs it to the quadrature modulating section 108.

Furthermore, using the transmission signal 514 as the target value, the estimating section 512 renews a coefficient updating signal 527 in compliance with the distortion compensation coefficient read as coefficient updating signal 527 through the write selecting section 513, amplitude information 515, amplitude comparison result 517 and feedback base band signal 124 and outputs the first updating signal 528 or the second updating signal 529.

The write section 513 selects the renewed coefficient updating signal 527 from the first updating signal 528 and the second updating signal 529 on the basis of the amplitude comparison result 517 and renews the distortion compensation coefficients of the first compensation table 504 or the second compensation table 505. For example, in a case where the amplitude comparison result 517 shows that the amplitude is smaller than the threshold value, the write selecting section 513 selects the renewed coefficient updating signal 527 from the first updating signal 528 and renews a distortion compensation coefficient of the first compensation table 504, and in a case where the amplitude comparison result 517 shows that the amplitude is larger than the threshold value, the write selecting section 513 selects the renewed coefficient updating signal 527 from the second updating signal 529, and renews the distortion compensation coefficient of the second compensation table 505.

Therefore, in a prior nonlinear distortion compensation technique, the maximum amplitude signal is assigned to the maximum output value of an amplifier. However, since signals having the maximum amplitude have a very low ratio of existence, they will not exert any great influence as leak power even though the maximum amplitude signals are slightly distorted. Therefore, the distortion compensation coefficient is renewed so as to keep the linearity in the first compensation table, and the distortion compensation coefficient is renewed so as to adjust only the phase in the second compensation table, wherein it is possible to cause signals of a large amplitude to have a feature by which the signals are not greatly distorted since the linearity is kept at the phase components while the amplitude is properly limited by a lowering of the gain of the amplifier.

Furthermore, since the amplitude of the maximum amplitude signal is limited, the mean amplitude is relatively increased, and it is possible to improve the amplification efficiency of an amplifier.

Thus, according to the fifth embodiment, since it is possible to control the distortion components with a simple construction, it is possible to construct a more efficient transmission apparatus than a conventional nonlinear distortion compensation technique.

(Embodiment 6)

Figure 6:
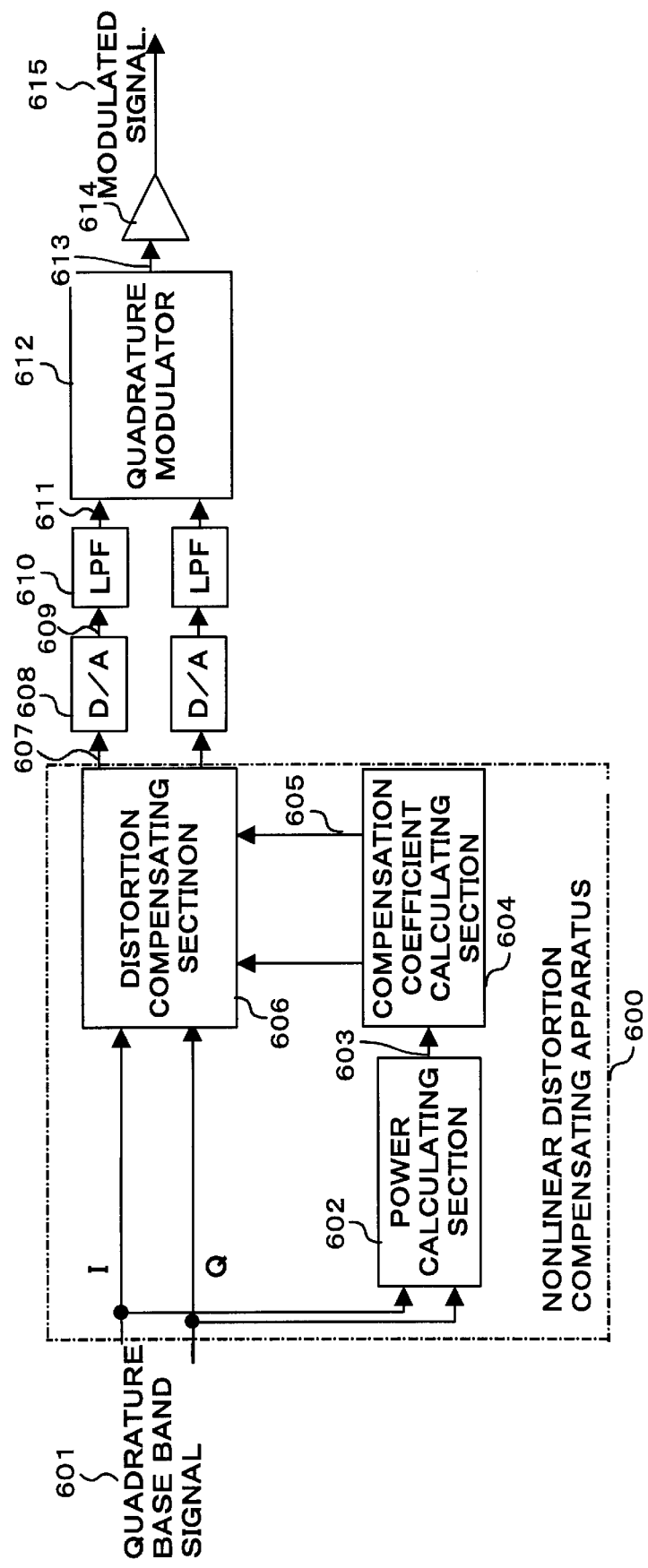
FIG. 6 is a main block diagram of a transmission apparatus according to a sixth embodiment of the invention.

FIG. 6 is a main block diagram of a transmission apparatus according to the sixth embodiment of the invention.

In FIG. 6, reference number 600 indicate a nonlinear distortion compensating section, reference number 601 indicate a transmission digital quadrature base band signal on I and Q channels, reference number 602 indicate a power calculating section, reference number 603 indicate an amplitude value calculated in the power calculating section 602, reference number 604 indicate a compensation coefficient calculating section for nonlinear distortion compensation, reference number 605 indicate quadrature nonlinear distortion compensation data, reference number 606 indicate a distortion compensating section, reference number 607 indicate a quadrature base band signal for which nonlinear distortion is compensated, reference number 608 indicate a D/A converting section, reference number 609 indicate an analog quadrature base band signal, reference number 610 indicate a low band pass filter for limiting the band, reference number 611 indicate a band-limited analog quadrature base band signal, reference number 612 indicate a quadrature modulator, reference number 613 indicate a modulation signal, reference number 614 indicate a transmission system amplifier, and reference number 615 indicate an amplified transmission modulation signal.

Furthermore, the nonlinear distortion compensating section 600 is achievable by a surplus calculation performance of DSP (not illustrated), which is a component of the transmission apparatus. That is, calculation equations which are used by each power calculating section 602, compensation coefficient calculating section 604, and distortion compensating section 606 is incorporated in programs of the DSP, and a coefficient which the compensation coefficient calculating section 604 uses for calculation is achievable by being stored in a data area in the programs of the DSP.

A description is given of the actions of the transmission apparatus thus constructed. Firstly, an amplitude value 603 of a transmission signal is calculated by the power calculating section 602 on the basis of the transmission digital quadrature base band signal 601. This is calculated as shown in the following equation (1) where the amplitude value 603 is assumed to be "P".

$$P = I^2 + Q^2 \qquad (1)$$

Next, using the calculated transmission signal amplitude value 603 as an input value, nonlinear distortion compensation data 605, having an inversed characteristic of the transmission system nonlinear distortion characteristics, in which the nonlinear distortion compensation data is quadratured, is calculated by the compensation coefficient calculation section 604. This is, for example, an n-dimensional polynomial in which P is used as an input, wherein the same phase component Ci and quadrature component Cq are calculated as in the following equations (2) and (3).

$$Ci = a_{in}P^n + a_{in-1}P^{n-1} + \ldots + a_{i1}P^1 + a_{i0}P^0 \qquad (2)$$

$$Cq = a_{qn}P^n + a_{qn-1}P^{n-1} + \ldots + a_{q1}P^1 + a_{q0}P^0 \qquad (3)$$

The distortion compensating section 606 provides a complex product of the transmission digital quadrature base band signal 601 and the quadratured nonlinear distortion compensation data 605 and outputs a quadrature base band signal 607, the nonlinear distortion of which is compensated. This is calculated as in the following equations (4) and (5) where I and Q channel components of the quadrature base band signal 607 are respectively I' and Q';

$$I' = IC_i - QC_q \qquad (4)$$

$$Q' = IC_q + QC_i \qquad (5)$$

The quadrature base band signal 607 in which the nonlinear distortion is compensated is converted to analog signals by a D/A converting section 608, and is band-limited by a low band pass filter 610, wherein an analog quadrature base band signal 611 is obtained. After quadrature modulation is carried out by a quadrature modulator 612 and a modulated signal 613 is obtained, it is amplified to a necessary size by a transmission system amplifier 614, wherein a transmission modulation signal 615 is outputted.

Furthermore, a quadrature modulator 612 is replaced for such a type as is able to carry out quadrature modulation of digital quadrature base band signals, and a D/A converter and a low band pass filter may be connected between the quadrature modulator and amplifier 614.

This, according to the sixth embodiment, the nonlinear distortion compensating section 600 is constructed so that signal power is obtained from the inputted quadrature base band signal, a distortion compensation coefficient is calculated by an approximation equation for distortion compensation, in which the value is used as a parameter, nonlinear distortion compensation is carried out using the distortion compensation coefficient, and simultaneously the coefficient of the approximation equation is renewed using an error between the quadrature signal obtained by demodulating the output to which the modulation output is shared, and the quadrature base band signal. Therefore, nonlinear distortion compensating section 600 for compensating nonlinear distortions generated in the transmission system amplifier 614 can be constructed to be small-sized without use of memory tables achieved by a RAM or a ROM, etc.

(Embodiment 7)

Figure 7:
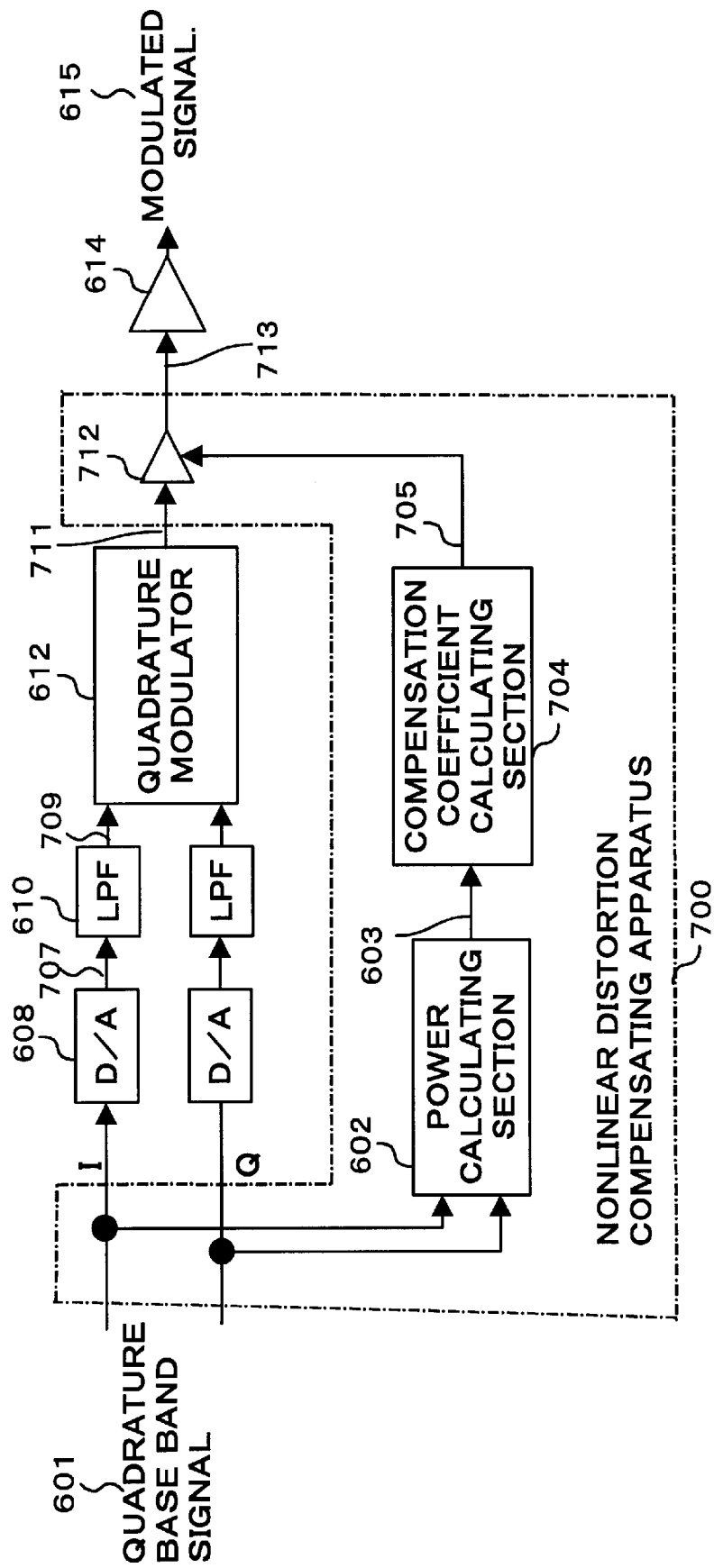
FIG. 7 is a main block diagram of a transmission apparatus according to a seventh embodiment of the invention.

FIG. 7 is a main block diagram of a transmission apparatus of a seventh embodiment of the invention. However, parts of the seventh embodiment, shown in FIG. 7, which correspond to those of the sixth embodiment shown in FIG. 6 are given the same reference numbers, and the description thereof is omitted.

In FIG. 7, reference number 700 indicate a nonlinear distortion compensating section, reference number 704 indicate a compensation coefficient calculating section for amplitude distortion compensation, reference number 705 indicate amplitude distortion compensation data, reference number 707 indicate an analog quadrature base band signal, reference number 709 indicate a band-limited analog quadrature base band signal, reference number 711 indicate a modulation signal, reference number 712 indicate a gain controlling amplifier for amplitude distortion compensation, and reference number 613 indicate a modulation signal, the amplitude distortion of which is compensated. Furthermore, the nonlinear distortion compensating section 700 is achievable by surplus calculation performance of the DSP (not illustrated), which is a component of the transmission apparatus.

A description is given of the actions of the transmission apparatus thus constructed. First, amplitude value 603 of transmission signal is calculated by the power calculating section 602 on the basis of transmission digital quadrature base band signal 601. Next, the amplitude value 603 of the calculated transmission signal is used as an input value, wherein amplitude distortion compensation data 705 having an inversed characteristic of the amplitude distortion characteristic of the transmission system is calculated by the compensation coefficient calculating section 704 using an approximation equation.

On the other hand, transmission digital quadrature base band signal 601 is converted to analog signals by D/A conversion section 608, and the band is limited by a low band pass filter 610, wherein an analog quadrature base band signal 709 is obtained. After quadrature modulation is carried out by a quadrature modulator 612 to obtain a modulation signal 711, amplitude distortion compensation is carried out by a gain controlling amplifier 712 for compensating the amplitude distortion on the basis of amplitude distortion compensation data 705, thereby causing a modulation signal 613 to be obtained, the amplitude distortion of which is compensated. Finally, the signal is amplified to a size necessary for the amplifier 614, and a transmission modulation signal 615 is outputted.

Furthermore, it may be constructed that the quadrature modulator 612 is replaced for such a type that modulates the digital quadrature base band signals for quadrature, and a D/A converting section and a low band pass filter are connected between the quadrature modulator and gain controlling amplifier 712.

Thus, according to the seventh embodiment, since the nonlinear distortion compensating section 700 is constructed so that signal power is obtained from the quadrature base band signal inputted, the amplitude distortion compensation coefficient is calculated by an approximation equation for compensating the distortion, in which the value is used as a parameter, the amplitude distortion of the quadrature modulation signal is compensated on the basis of the amplitude distortion compensating coefficient using the same coefficient, and a modulation signal is obtained, the amplitude distortion of which is compensated. Thus, the nonlinear distortion compensating section 700 can be constructed to be small-sized without use of a memory table which is achieved by a RAM or ROM, etc.

(Embodiment 8)

Figure 8:
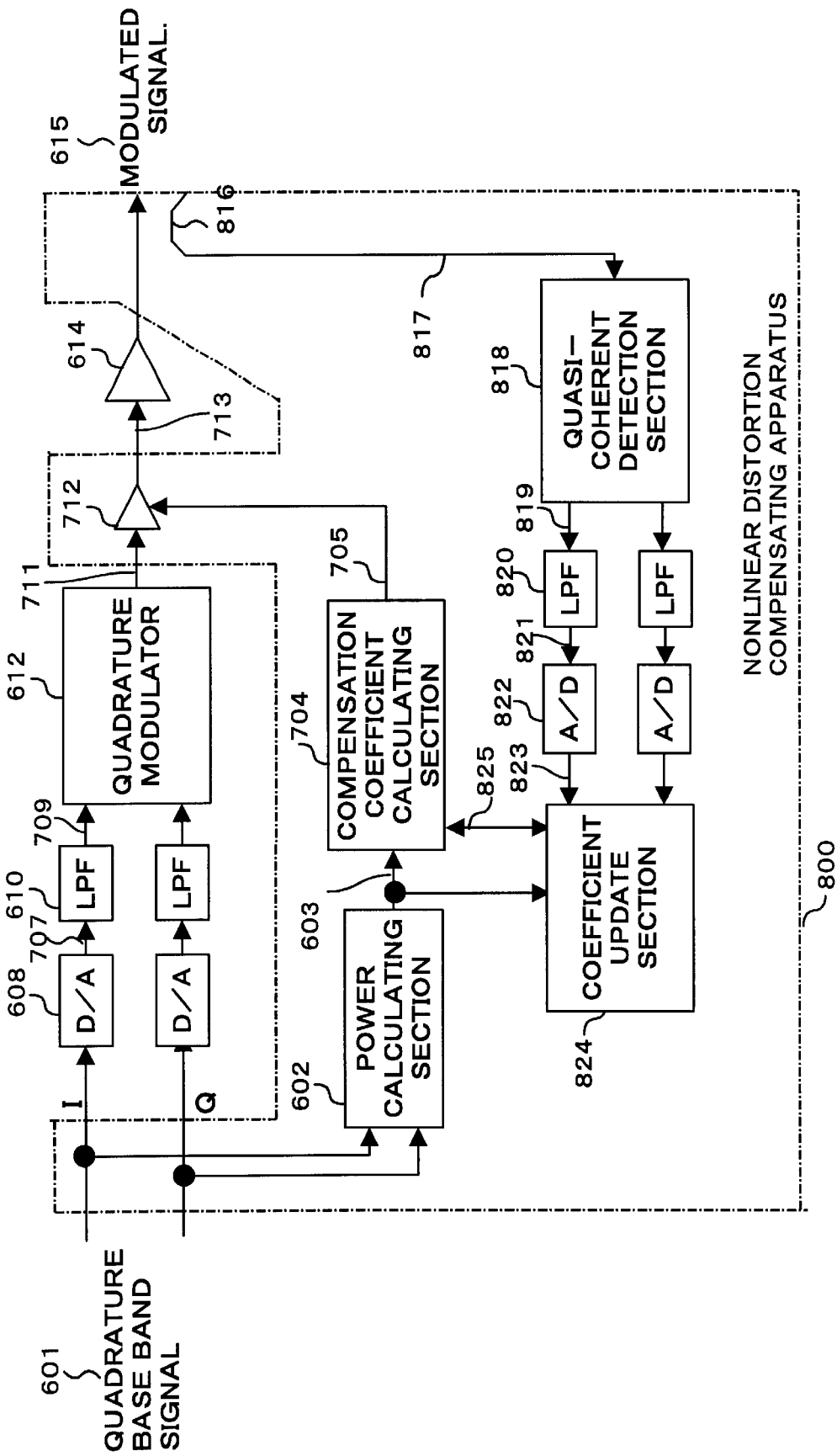
FIG. 8 is a main block diagram of a transmission apparatus according to a eighth embodiment of the invention.

FIG. 8 is a main block diagram of a transmission apparatus according to an eighth embodiment of the invention. However, parts of the eighth embodiment, shown in FIG. 8, which correspond to those of the sixth and seventh embodiments shown in FIG. 6 and FIG. 7 are given the same reference numbers, and the description thereof is omitted.

In FIG. 8, reference number 800 indicate a nonlinear distortion compensating section, reference number 816 indicate a directivity coupler, reference number 817 indicate a transmission modulation signal shared, reference number 818 indicate a quadrature demodulator, reference number 819 indicate a quadrature base band signal, the quadrature of which is detected, reference number 820 indicate a low band pass filter for limiting the band, reference number 821 indicate a quadrature base band signal, the band of which is limited, reference number 822 indicate an A/D converter section, reference number 823 indicate digital quadrature base band signal, reference number 824 indicate a coefficient renewing section. Reference number 825 indicate coefficient data of an approximation equation for calculation of a compensation coefficient.

Furthermore, the power calculating section 602, compensation coefficient calculating section 704 and coefficient renewing section 824 of the nonlinear distortion compensating section 800 are achievable through the surplus calculation performance of the DSP (not illustrated), which is a component of the transmission apparatus.

A description is given of the actions of the transmission apparatus thus constructed. Firstly, the amplitude value 603 of transmission signal is calculated by the power calculating section 602 on the basis of transmission digital quadrature base band signal 601. Next, the calculated amplitude value 603 of the transmission signal is used as an input value, wherein amplitude distortion compensation data 705 having an inversed characteristic of the amplitude distortion characteristics of transmission system is calculated by the compensation coefficient calculating section 704 using an approximation equation.

On the other hand, the transmission digital quadrature base band signal 601 is converted to analog signals by the D/A converting section 606, and the band is limited by a low band pass filter 610, thereby causing an analog quadrature base band signal 709 to be obtained. After quadrature modulation is carried out by quadrature modulator 612 to obtain modulation signals 711, the amplitude distortion compensation is carried out by a gain controlling amplifier 712 for compensating the amplitude distortion on the basis of the amplitude distortion compensation data 705, thereby causing modulation signals 713 to be obtained, the amplitude distortion of which is compensated. The signals are amplified to a necessary size by an amplifier 614, and transmission modulation signals 615 are outputted. At this time, the transmission modulation signals 615 are shared by a directivity coupler 816.

The shared transmission modulation signals 817 are detected by a quadrature demodulator 818. After they pass through a low band pass filter 820 for limiting the band, they are converted to digital signals by an A/D converting section 822, thereby causing digital quadrature base band signals 823 to be obtained. The coefficient data 825 of the approximation equation is renewed by the coefficient renewing section 824 so that the difference between the amplitude of digital quadrature base band signal 823 and the amplitude value 603 of the transmission signal is minimized.

Thus, according to the eighth embodiment, the nonlinear distortion compensating section 800 is constructed so that signal power is obtained on the basis of the inputted quadrature base band signals, the amplitude distortion compensation coefficient is calculated by an approximation equation for compensating the distortion, in which the value of signal power is used as a parameter, an amplitude distortion of the quadrature modulation signal is compensated on the basis of the amplitude distortion compensation coefficient using the coefficient, the modulation signals, the amplitude distortion of which is compensated, is shared, and the amplitude compensation coefficient is renewed so that the difference between the detected signal (output signal) and the input signal having power obtained beforehand is minimized after the shared modulation signals are detected for quadrature. Therefore, the nonlinear distortion compensating section 800 can be constructed to be small-sized without use of a memory table achievable by a RAM or ROM, etc., and at the same time it is possible to compensate distortion changes due to environmental changes such as in temperature, etc.

(Embodiment 9)

Figure 9:
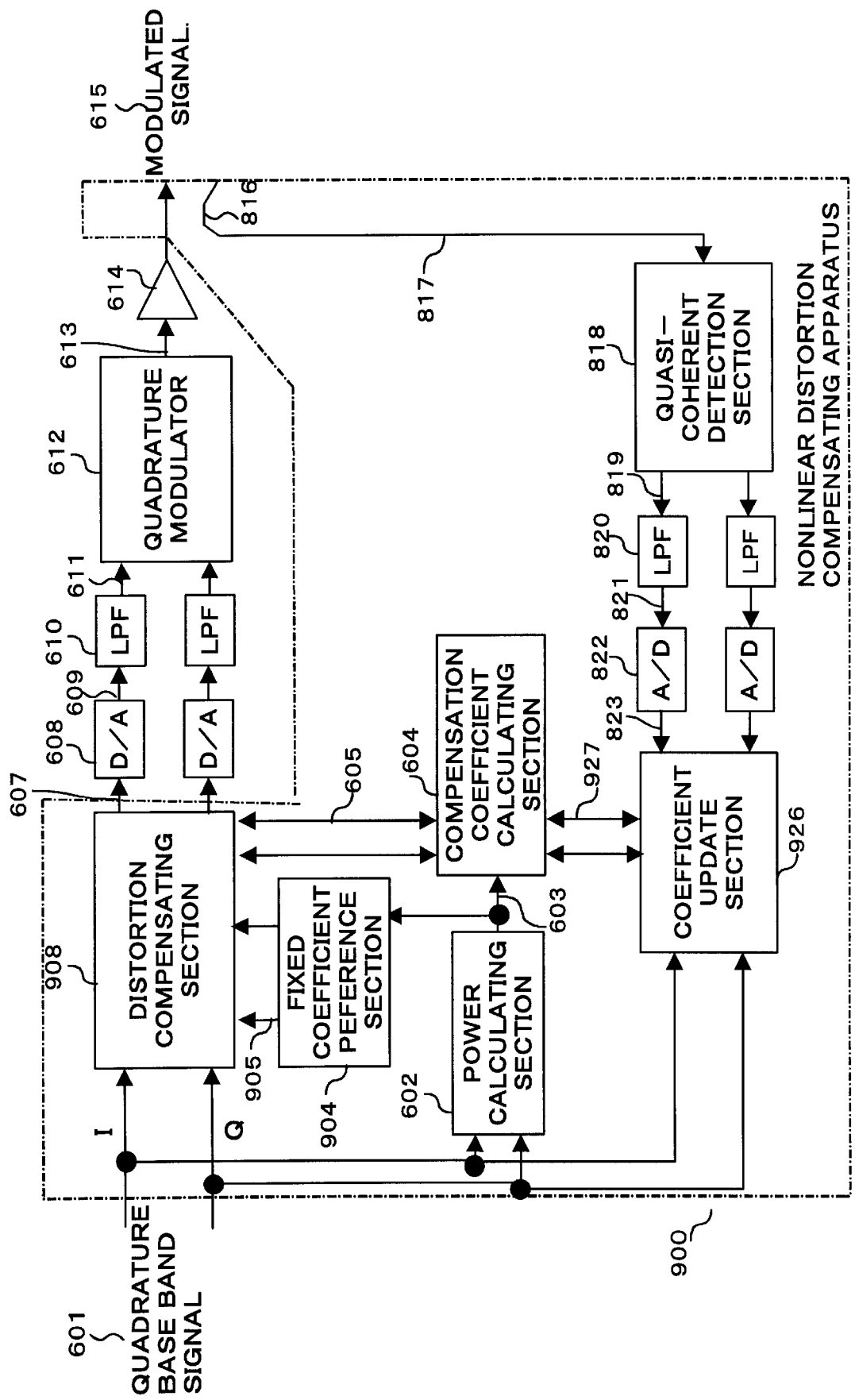
FIG. 9 is a main block diagram of a transmission apparatus according to a ninth embodiment of the invention.

FIG. 9 is a main block diagram of the transmission apparatus of a ninth embodiment of the invention. However, parts of the ninth embodiment shown in FIG. 9, which correspond to those of the sixth and eighth embodiments shown FIG. 6 and FIG. 8 are given the same reference numbers, and the description thereof is omitted.

In FIG. 9, reference number 900 indicate a nonlinear distortion compensating section, reference number 904 indicate a fixed coefficient reference section by ROM, which refers to a fixed compensation coefficient for compensating nonlinear distortions using the amplitude value 603, reference number 905 indicate a quadratured fixed nonlinear distortion compensation coefficient, reference number 908 indicate a distortion compensating section, reference number 926 indicate a coefficient renewing section, and reference number 927 indicate coefficient data of an approximation equation for calculation of compensation coefficients.

Furthermore, the power calculating section 602, compensation coefficient calculating section 604 and coefficient renewing section 926 of the nonlinear distortion compensating section 900 are achievable by surplus calculation performance of the DSP (not illustrated), which is a component of the transmission section.

A description is given of the actions of a transmission section thus constructed. First, the amplitude value 603 of transmission signals is calculated by the power calculating section 602 on the basis of the transmission digital quadrature base band signal 601 as in the abovementioned equation (1). Next, with reference to the fixed coefficient reference section 904 as using the amplitude value 603 of the calculated transmission signal as an address, the nonlinear distortion compensation data having an inversed characteristic of the nonlinear distortion characteristics of the transmission system calculated in advance is obtained as a quadratured nonlinear distortion compensation coefficient 905.

Herein, it is assumed that wherein the amplitude value 603 is P as shown in the equation (1), a nonlinear distortion compensation coefficient 905 corresponding to P is (di, dq).

Simultaneously, the amplitude value 603 of the transmission signal calculated is used as an input value, wherein a correcting coefficient 605 for correcting the nonlinear distortion compensation coefficient 905 is calculated by the correcting coefficient calculating section 604 using the abovementioned approximation equations (2) and (3).

The distortion compensating section 908 carries out a complex product of a transmission digital quadrature base band signal 601, a quadratured nonlinear distortion compensation data 905 and correcting coefficient 605, and outputs a quadrature base band signal 607, the nonlinear distortion of which is compensated.

This is calculated by the following equations (6) and (7), first using (di, dq) of the nonlinear distortion compensation coefficient where the I and Q channel components of the quadrature base band signal 607 are respectively I" and Q".

$$I'=Idi-Qdq \quad (6)$$

$$Q'=Idq+Qdi \quad (7)$$

Next, (Ci, Cq) of the correcting coefficient 605 is used with respect to the result of the abovementioned equations (6) and (7), and calculation is made as in the following equations (8) and (9).

$$I''=I'Ci-Q'Cq \quad (8)$$

$$Q''=I'Cq+Q'Ci \quad (9)$$

The quadrature base band signals 607 for which the nonlinear distortion is thus compensated are converted to analog signals by a D/A conversion section 608 and the band thereof is limited by a low band pass filter 610, thereby causing analog quadrature base band signals 611 to be obtained. After the signals are quadrature-modulated by a quadrature modulator 612 to obtain modulation signals 613, they are amplified by an amplifier 614 of the transmission system to a necessary size, and transmission modulation signals 615 are outputted. At this time, the transmission modulation signals 615 are shared by a directivity coupler 816.

The shared transmission modulation signals 817 are detected by a quadrature demodulator 818, and pass through a low band pass filter 820 for limiting the band. Thereafter, the signals are converted to digital signals by an A/D converting section 822 to obtain digital quadrature base band signals 823. The coefficient data 927 of approximation equations for calculating the correcting coefficients are renewed by a coefficient renewing section 926 so that the difference between the quadrature base band signals 601 and 823 is minimized.

Thus, according to the ninth embodiment, the nonlinear distortion compensating section 900 is constructed so that signal power is obtained from the quadrature base band signals inputted, nonlinear distortion compensation coefficients are obtained using the value of signal power as a parameter, compensation coefficients are calculated by approximation equations for compensating distortions to carry out distortion compensations using the coefficients, modulation signals in which the distortion compensation signals are modulated for quadrature are shared, and the compensation coefficients of approximation equations are renewed so that the difference between the detection signals (output signals) and input signals for which power is obtained in advance is minimized after the shared modulation signals are detected for quadrature. Therefore, the nonlinear distortion compensating section 900 can be constructed so as to achieve high accuracy and compensate the distortions changing in line with changes of the environments due to temperature changes, etc.

Furthermore, the respective nonlinear distortion compensating sections 600, 700, 800, and 900 described above according to embodiments 6 through 9 shown in FIGS. 6 through 9 may be replaced for any one of the nonlinear distortion compensating sections 104, 201, 501 shown in FIGS. 1 through 5. However, when replacing nonlinear distortion compensation sections, it is necessary that a matching is secured with respect to the type of quadrature modulators, positions of the D/A converting section and low band pass filter, and position of gain controlling amplifier 712 on the basis of the description made with respect to the first through the ninth embodiments.

Furthermore, each of the nonlinear distortion compensating sections 600, 900 may be composed of integrated circuits by a hardware configuration using logic circuits, etc. individually, or with its transmission apparatus included in a DSP (not illustrated), which is a component.

Still furthermore, three elements, that is, amplitude calculating section 101, limiting coefficient calculating section 301 and amplitude limiting section 103 shown in FIG. 3 and FIG. 4 may be composed of integrated circuits by a hardware configuration combination with any one of the respective nonlinear distortion compensating sections 600, 900, or they may be composed of integrated circuits by a hardware configuration combined with any one of the respective nonlinear distortion compensating sections 600, 900, and included in the DSP.

In a case where they are composed of integrated circuits, the nonlinear distortion compensation can be carried out at a high speed.

Industrial Applicability

As described above, a transmission apparatus according to the invention is very useful as a transmission apparatus of radio communication systems and is suitable for compensation of nonlinear distortions generated in the transmission system.

What is claimed is:

1. A transmission apparatus comprising:
   a first amplitude calculating means for calculating a first amplitude value of a transmission quadrature base band signals;
   an amplitude limiting table for storing amplitude limiting information corresponding to said first amplitude value;
   a first amplitude limiting means for limiting the amplitude of said transmission quadrature base band signals using said amplitude limiting information;
   a quadrature modulating means for modulating the amplitude limited transmission quadrature base band signals to output a radio frequency (RF) signals; and
   amplifying means for amplifying said RF signals.

2. The transmission apparatus as set forth in claim 1, further comprising:
   nonlinear distortion compensating means for compensating nonlinear distortion of the transmission quadrature base band signals amplitude limited by the first amplitude limiting means,
   wherein the transmission quadrature base band signals for which the nonlinear distortion is compensated by said nonlinear distortion compensating means are inputted into said quadrature modulating means.

3. A transmission apparatus as set forth in claim 2, wherein
   said nonlinear distortion compensating means includes a second amplitude calculating means for calculating a second amplitude value of the transmission quadrature base band signal, the amplitude of which is limited by the first amplitude limiting means; a compensation table for storing nonlinear distortion compensation information corresponding to said second amplitude value; a distortion compensating means for compensating a distortion of the amplitude limited transmission quadrature base band signals by using said nonlinear distortion compensation information to output the transmission quadrature base band signals; coupling means for feeding back a part of radio frequency (RF) signals amplified by an amplifying means; a demodulating means for demodulating said feedback RF signals to feedback base band signals; and an estimating means for updating said nonlinear distortion compensation information using said amplitude-limited transmission quadrature base band signals, said feedback base band signals, and said second amplitude value to rewrite said compensation table.

4. A transmission apparatus as set forth in claim 2, wherein said nonlinear distortion compensating means includes a compensation table for storing nonlinear compensation information corresponding to the first amplitude value; distortion compensating means for compensating a distortion of the transmission quadrature base band signals, the amplitude of which is limited by the first amplitude limiting means, by using said nonlinear compensation information to output the transmission quadrature base band signals; coupling means for feeding back a part of said RF signals amplified by an amplifying means; demodulating means for demodulating said feedback RF signals to feedback base band signals; and estimating means for updating said nonlinear distortion compensation information by using said amplitude-limited transmission quadrature base band signals, said feedback base band signals and said first amplitude value to rewrite said compensation table.

5. A transmission apparatus as set forth in claim 2, wherein said nonlinear distortion compensating means includes a second amplitude calculating means for calculating the second amplitude value of the transmission quadrature base band signals having amplitude limited by the first amplitude limiting means; threshold value storing means for storing a threshold value defined in advance; comparing means for comparing said amplitude value with said threshold value; a first compensation table for storing a nonlinear compensation coefficient corresponding to said amplitude value; a second compensation table for storing a phase compensation coefficient corresponding to said amplitude value; coefficient selecting means for selecting said nonlinear compensation coefficient or said phase compensation coefficient on the basis of comparison results of said comparing means; distortion compensating means for compensating the distortion of said transmission quadrature base band signals using said nonlinear compensation coefficient or said phase compensation coefficient, which is selected by said coefficient selecting means; coupling means for feeding back a part of said RF signals amplified by the amplifying means; demodulating means for demodulating said feedback RF signals to feedback base band signals; estimating means for estimating new coefficient information of the respective said nonlinear compensation coefficient and said phase compensation coefficient using said transmission quadrature base band signal, said feedback base band signal, said amplitude value and said comparison result; and writing means for rewriting said nonlinear compensation coefficient and said phase compensation coefficient using said comparison result and said coefficient renewal information.

6. A transmission apparatus as set forth in claim 2, wherein said nonlinear distortion compensating means includes power calculating means for calculating a power value of transmission quadrature base band signals having amplitude limited by the first amplitude limiting means; compensation coefficient calculating means for calculating a nonlinear distortion compensation coefficient by an approximation equation defined in advance using said power value; and distortion compensating means for compensating the nonlinear distortion of said transmission quadrature base band signals using said nonlinear distortion compensation coefficient.

7. A transmission apparatus as set forth in claim 2, wherein said nonlinear distortion compensating means includes power calculating means for calculating a power value of transmission quadrature base band signals, the amplitude of which is limited by the first amplitude limiting means; compensating coefficient calculating means for calculating an amplitude distortion compensating coefficient by approximation equations set in advance using said power value; and amplitude distortion compensating means for compensating amplitude distortion using said amplitude compensating coefficient with respect to the quadrature modulation signals obtained by a quadrature modulating means quadrature-modulating said transmission quadrature base band signals.

8. A transmission apparatus as set forth in claim 2, wherein said nonlinear distortion compensating means includes power calculating means for calculating a power value of transmission quadrature base band signals, the amplitude of which is limited by the first amplitude limiting means; compensating coefficient calculating means for calculating an amplitude distortion compensating coefficient by approximation equations set in advance using said power value; amplitude distortion compensating means for compensating amplitude distortion using said amplitude distortion compensating coefficient with respect to the quadrature modulation signals obtained by said quadrature modulating means quadrature-modulating said transmission quadrature base band signals; coupling means for coupling the outputs of said amplifying means; quadrature demodulating means for quadrature demodulating one of the outputs from said coupling means as an input; and coefficient updating means for calculating a error between the quadrature demodulating signal and said power value through comparison and for updating the value of coefficients of said approximation equations on the basis of said error.

9. A transmission apparatus as set forth in claim 2, wherein said nonlinear distortion compensating means includes power calculating means for calculating a power value of transmission quadrature base band signals, the amplitude of which is limited by the first amplitude limiting means; table referencing means for outputting a distortion compensation coefficient from a nonlinear distortion compensating table set in advance using said power value; correcting coefficient calculating means for using said power value as an input and for calculating a correcting value of said distortion compensating coefficient using approximation equations; distortion compensating means for compensating nonlinear distortion of said transmission quadrature base band signal using said distortion compensating coefficient and said correcting coefficient; coupling means for coupling the outputs of said amplifying means; quadrature demodulating means for quadrature demodulating one of the outputs of said coupling means as an input; and coefficient updating means for calculating the error between the quadrature demodulating signal and said transmission quadrature base band signal through comparison and for updating the value of coefficients of said approximation equations on the basis of said error.

10. A transmission apparatus as set forth in claim 2, wherein said nonlinear distortion compensating means is composed of integrated circuits.

11. A transmission apparatus as set forth in claim 2, wherein said nonlinear distortion compensating means is composed of integrated circuits along with said first amplitude calculating means, said amplitude limiting table, and said first amplitude limiting means.

12. A transmission apparatus as set forth in claim 2, wherein said nonlinear distortion compensating means is included in a DSP for carrying out transmission processes and is composed of integrated circuits.

13. A transmission apparatus comprising:
first amplitude calculating means for calculating a first amplitude value from transmission quadrature base band signals;
limiting coefficient calculating means for calculating an amplitude limiting coefficient with respect to said first amplitude value;
first amplitude limiting means for limiting the amplitude of said transmission quadrature base band signals using said amplitude limiting coefficient;
quadrature modulating means for quadrature modulating the amplitude-limited transmission quadrature base band signals to output RF signals; and
amplifying means for amplifying said RF signals.

14. The transmission apparatus as set forth in claim 13, further comprising nonlinear distortion compensating means for compensating nonlinear distortion of the transmission quadrature base band signals, the amplitude of which is limited by the first amplitude limiting means, wherein the transmission quadrature base band signals in which the nonlinear distortion is compensated by said nonlinear distortion compensating means are input to said quadrature modulating means.

15. A transmission apparatus as set forth in claim 14, wherein said nonlinear distortion compensating means includes a second amplitude calculating means for calculating the second amplitude value of the transmission quadrature base band signals, the amplitude of which is limited by the second amplitude limiting means; a compensating table for storing nonlinear compensation information with respect to said second amplitude value; distortion compensating means for compensating distortion of the amplitude-limited transmission quadrature base band signals using said nonlinear compensation information to output the amplitude-limited transmission quadrature base band signals; coupling means for feeding back a part of RF signals amplified by an amplifying means; demodulating means for demodulating said fed back RF signals to feed back base band signals; and estimating means for updating said nonlinear compensation information using said amplitude-limited transmission quadrature base band signals, said feedback base band signals and said second amplitude value and rewriting said compensation table.

16. A transmission apparatus as set forth in claim 14, wherein said nonlinear distortion compensating means includes a compensation table for storing nonlinear compensation information corresponding to the first amplitude value; distortion compensating means for compensating nonlinear distortion of the amplitude limited transmission quadrature base band signals using said nonlinear compensation information to output the distortion compensated transmission quadrature base band; coupling means for feeding back a part of said RF signals amplified by said amplifying means; demodulating means for demodulating said fed back RF signals to feedback base band signals; estimating means for updating said nonlinear compensation information using said amplitude-limited transmission quadrature base band signals, said feedback base band signals and said first amplitude value and for rewriting said compensation table.

17. A transmission apparatus as set forth in claim 14, wherein said nonlinear distortion compensating means includes a second amplitude calculating means for calculating the second amplitude value of the transmission quadrature base band signals, the amplitude of which is limited by the second amplitude limiting means; threshold value storing means for storing threshold values defined in advance; comparing means for comparing said amplitude values with said threshold values; a first compensation table for storing a nonlinear compensation coefficient corresponding to said amplitude value; a second compensation table for storing a phase compensation coefficient corresponding to said amplitude value; coefficient selecting means for selecting said nonlinear compensation coefficient or said phase compensation coefficient on the basis of the results of comparison of said comparing means; distortion compensating means for compensating distortion of said transmission quadrature base band signals using said nonlinear compensation coefficient or said phase compensation coefficient selected by said coefficient selecting means; coupling means for feeding back a part of said RF signals amplified by the amplifying means; demodulating means for demodulating said fed back RF signals to feedback base band signals; estimating means for estimating new coefficient information of each of said nonlinear compensation coefficient and said phase compensation coefficient using said transmission quadrature base band signals, said feedback base band signals, said amplitude values and said comparison results; and rewriting means for rewriting said nonlinear compensating coefficient and said phase compensating coefficient using said comparison results and said new coefficient information.

18. A transmission apparatus as set forth in claim 14, wherein said nonlinear distortion compensating means includes power calculating means for calculating a power value of the transmission quadrature base band signals, the amplitude of which is limited by the second amplitude limiting means; compensating coefficient calculating means for calculating nonlinear distortion compensating coefficient by approximation equations set in advance using said power value; and distortion compensating means for compensating nonlinear distortion of said transmission quadrature base band signals using said nonlinear distortion compensating coefficient.

19. A transmission apparatus as set forth in claim 14, wherein said nonlinear distortion compensating means includes power calculating means for calculating a power value of the transmission quadrature base band signals, the amplitude of which is limited by the second amplitude limiting means; compensating coefficient calculating means for calculating amplitude distortion compensating coefficient by approximation equations set in advance using said power value; and amplitude distortion compensating means for compensating amplitude distortion using said amplitude distortion compensating coefficient with respect to the quadrature modulating signals obtained by said transmission quadrature base band signals being quadrature-modulated by said quadrature modulating means.

20. A transmission apparatus as set forth in claim 14, wherein said nonlinear distortion compensating means includes power calculating means for calculating a power value of the transmission quadrature base band signals, the amplitude of which is limited by the second amplitude limiting means; compensating coefficient calculating means for calculating amplitude distortion compensating coefficient by approximation equations set in advance using said power value; and amplitude distortion compensating means for compensating amplitude distortion using said amplitude distortion compensating coefficient with respect to the quadrature modulating signals obtained by said transmission quadrature base band signals being quadrature-modulated by said quadrature modulating means; coupling means for coupling the outputs of the amplifying means; quadrature demodulating means for using one of the outputs of said coupling means as an input and for detecting the same for quadrature; and coefficient updating means for calculating the error by comparing the quadrature demodulating signal with said power value and for updating the coefficient value of said approximation equations on the basis of said errors.

21. A transmission apparatus as set forth in claim 14, wherein said nonlinear distortion compensating means includes power calculating means for calculating a power value of the transmission quadrature base band signals, the amplitude of which is limited by the second amplitude limiting means; table referencing means for taking out distortion compensation coefficients from a nonlinear distortion compensation table set in advance using said power value; correcting coefficient calculating means for using said power value as an input and for calculating a correcting value of said distortion compensation coefficient using approximation equations; distortion compensating means for compensating nonlinear distortion compensation of said transmission quadrature base band signals using said distortion compensating coefficients and said correcting coefficients; coupling means for coupling the outputs of the amplifying means; quadrature demodulating means for using one of the outputs of said coupling means as an input and for detecting the same for quadrature; and coefficient updating means for calculating an error between the quadrature demodulating signal and said transmission quadrature base band signal and for updating the coefficient of said approximation equations on the basis of said error.

22. A transmission apparatus as set forth in claim 14, wherein the nonlinear distortion compensating means is composed of integrated circuits.

23. A transmission apparatus as set forth in claim 14, wherein the nonlinear distortion compensating means is composed of integrated circuits together with the first amplitude calculating means, amplitude limiting table and first amplitude limiting means.

24. A transmission apparatus as set forth in claim 14, wherein the nonlinear distortion compensating means is included in a DSP for carrying out transmission processes and is composed of integrated circuits.

25. A transmission apparatus comprising:
   a first amplitude calculator that calculates a first amplitude value of transmission quadrature base band signals;
   an amplitude limiting table that stores amplitude limiting information corresponding to said first amplitude value;

a first amplitude limiter that limits the amplitude of said transmission quadrature base band signals using said amplitude limiting information;

a quadrature modulator that modulates the amplitude limited transmission quadrature base band signals to output radio frequency signals; and an amplifier that amplifies said radio frequency signals.

26. The transmission apparatus as set forth in claim 25, further comprising:

a nonlinear distortion compensator that compensates nonlinear distortion of the transmission quadrature base band signals amplitude limited by the first amplitude limiter, wherein the transmission quadrature base band signals for which the nonlinear distortion is compensated by said nonlinear distortion compensator are input into said quadrature modulator.

27. A transmission apparatus comprising:

a first amplitude calculator that calculates a first amplitude value from transmission quadrature base band signals;

a limiting coefficient calculator that calculates an amplitude limiting coefficient with respect to said first amplitude value;

first amplitude limiter that limits the amplitude of said transmission quadrature base band signals using said amplitude limiting coefficient;

a quadrature modulator that modulates the amplitude-limited transmission quadrature base band signals to output radio frequency signals; and an amplifier that amplifies said radio frequency signals.

28. The transmission apparatus as set forth in claim 26, further comprising a nonlinear distortion compensator that compensates nonlinear distortion of the transmission quadrature base band signals, the amplitude of which is limited by the first amplitude limiter, wherein the transmission quadrature base band signals in which the nonlinear distortion is compensated by said nonlinear distortion compensator are input to said quadrature modulator.

* * * * *